US006444894B1

(12) United States Patent
Sterzel

(10) Patent No.: US 6,444,894 B1
(45) Date of Patent: Sep. 3, 2002

(54) THERMOELECTRICALLY ACTIVE MATERIALS AND GENERATORS CONTAINING THEM

(75) Inventor: Hans-Josef Sterzel, Dannstadt-Schauernheim (DE)

(73) Assignee: BASF Aktiengesellschaft, Ludwigshafen (DE)

( * ) Notice: Subject to any disclaimer, the term of this patent is extended or adjusted under 35 U.S.C. 154(b) by 0 days.

(21) Appl. No.: 09/712,291

(22) Filed: Nov. 15, 2000

(30) Foreign Application Priority Data

Nov. 19, 1999 (DE) .......................... 199 55 788

(51) Int. Cl.$^7$ .............................. H01L 35/30
(52) U.S. Cl. .................... 136/205; 136/236.1
(58) Field of Search .................. 136/201, 203, 136/205, 236.1, 238–241

(56) References Cited

U.S. PATENT DOCUMENTS 5,448,109 A    9/1995   Cauchy ..................... 257/719

FOREIGN PATENT DOCUMENTS

JP    4-133481    *   5/1992

OTHER PUBLICATIONS

Kajikawa, T.; Shida, K.; Sugihara, S.; Ohmori, M.; Hirai, T.; Thermoelectric Properties of Magnesium Processed by Powdered Elements Plasma Activated Sintering Method, 16$^{th}$ International Conference on Thermoelectrics, 1997, pp. 275–279.*

* cited by examiner

*Primary Examiner*—Bruce F. Bell
*Assistant Examiner*—Thomas H. Parsons
(74) *Attorney, Agent, or Firm*—Keil & Weinkauf

(57) ABSTRACT

In a generator comprising a p-doped or n-doped semiconductor material, said semiconductor material is at least one ternary material selecting from one of the following substance classes and formed by combining at least two compounds of the substance class: suicides, borides, germanides, tellurides, sulfides, selenides, antimonides, plumbides and semiconductor oxides.

10 Claims, No Drawings

THERMOELECTRICALLY ACTIVE MATERIALS AND GENERATORS CONTAINING THEM

BACKGROUND OF THE INVENTION

1. Field of the Invention

The present invention relates to thermoelectrically active materials and generators containing them and processes for preparing and testing of said thermoelectrically active materials and arrays obtained therefrom.

2. Description of the Related Art

Thermoelectric generators as such have been known for a long time. Electrical charges are transported through an external electric circuit by p-doped and n-doped semiconductors which are heated on one side and cooled on the other, electrical work is performed on a load in the electric circuit. The efficiency of the conversion of heat into electrical energy which is achieved is limited thermodynamically by the Carnot efficiency. Thus, at a temperature of 1000 K on the hot side and 400 K on the "cold" side, the possible efficiency would be (1000–400) divided by 1000=60%. Unfortunately efficiencies of only 10% are achieved today.

A good overview of effects and materials is given, for example, by Cronin B. Vining, ITS Short Course on Thermoelectricity, Nov. 8, 1993 Yokohama, Japan.

At present, thermoelectric generators are employed in space probes to generate direct currents, for cathodic corrosion protection of pipelines, for supplying light buoys and radio buoys with energy, for radio and TV operation. The advantages of thermoelectric generators are their exceptional reliability, they function independently of atmospheric conditions such as humidity, there is no vulnerable transport of matter, but only a transport of charges; the operating material is burnt continuously, even catalytically without a free flame, releasing only minor amounts of CO, $NO_x$ and unburned operating material; any operating material may be used from hydrogen via natural gas, petrol, kerosene, diesel fuel to biologically produced fuels such as rapeseed oil methyl ester.

Thus, thermoelectric energy conversion adapts very flexibly to future needs such as hydrogen economy or energy generation from regenerative energies.

A particularly attractive application would be the use for conversion into electrical energy in electrically powered vehicles. There would be no need for altering the existing filling station network. However, such an application would require efficiencies of more than 30%.

It is therefore an object of the present invention to provide novel, thermoelectrically active materials which make it possible to achieve higher efficiencies than previously. Thermoelectric materials are characterized by the so called Z factor (figure of merit)

$$Z = \frac{\alpha^2 * \sigma}{K}$$

where $\alpha$ is the Seebeck coefficient, $\sigma$ is the electrical conductivity and K is the thermal conductivity.

Closer analysis shows that the efficiency $\eta$ derives from $$\eta = \frac{T_{high} - T_{low}}{T_{high}} * \frac{M-1}{M + \frac{T_{high}}{T_{low}}}$$

where $$M=[1+\tfrac{z}{2}(T_{high}-T_{low})]^{1/2}$$

(see also Mat. Sci. and Eng. B29 (1995) 228).

The aim is therefore to provide a material having a very high Z value and high realizable temperature difference. From a solid state physics point of view, many problems are to be overcome here:

A high $\alpha$ implies a high electron mobility in the material; i.e. electrons (or holes in the case of p-conducting materials) must not be bound strongly to the atomic core. Materials which have a high electrical conductivity often have a high thermal conductivity (Wiedemann-Franz law), which is why it is not possible to influence Z in a favorable way. Currently used materials such as $Bi_2Te_3$, PbTe or SiGe are already a compromise. For example, alloying reduces the electrical conductivity less than the thermal conductivity. Because of that, use is preferably made of alloys such as $(Bi_2T_3)_{90}(Sb_2T_3)_5(Sb_2Se_3)_5$ or $Bi_{12}Sb_{23}Te_{65}$ as described in U.S. Pat. No. 5,448,109.

For thermoelectric materials of high efficiency, it is preferred that further boundary conditions be satisfied. In particular, they must be temperature-stable to be able to operate at operating temperatures of from 1000 to 1500 K for years without substantial loss of efficiency. This implies high temperature-stable phases per se, a stable phase composition and a negligible diffusion of alloy constituents into the adjacent contact materials.

SUMMARY OF THE INVENTION

We have found that this object is achieved by a thermoelectric generator comprising a p-doped or n-doped semiconductor material, wherein said semiconductor material is at least one ternary material selected from one of the following substance classes and formed by combining at least 2 compounds of the substance class:

(1) Silicides $U_3Si_5$, $BaSi_2$, $CeSi_2$, GdSi, $NdSi_2$, CoSi, $CoSi_2$, $CrSi_2$, FeSi, $FeSi_2$, MnSi, $MoSi_2$, $WSi_2$, VSi, $TiSi_2$, $ZrSi_2$, $VSi_2$, $NbSi_2$ and $TaSi_2$ (2) Borides $UB_2$, $UB_4$, $UB_{12}$, $CeB_6$, $AlB_{12}$, CoB, $CrB_2$, $CrB_4$, FeB, MnB, $MnB_2$, $MnB_{12}$, MoB, $MoB_4$, $SiB_4$, $SiB_6$, $SiB_{12}$, $TiB_2$, $VB_2$, $YB_4$, $ZrB_2$, $CuB_{24}$, $NiB_{12}$, $BaB_6$, $MgB_2$, $MgB_4$ and $MgB_{12}$, where the aluminum-containing borides may additionally contain one carbon atom per boron atom, (3) Germanides $U_5Ge_3$, BaGe, GdGe, $Dy_5Ge_3$, $Fr_5Ge_3$ and $Ce_3Ge_5$ (4) Tellurides, sulfides and selenides LaS, NdS, $Pr_2S_3$, DyS, USe, BaSe, GdSe, LaSe, $Nd_3Se_4$, $Nd_2Se_3$, PrSe, FrSe, UTe, GdTe, LaTe, NdTe, PrTe, SmTe, DyTe and ErTe (5) Antimonides USb, CeSb, GdSb, LaSb, NdSb, PrSb and DySb, AlSb, CeSb, CrSb, FeSb, $Mg_3Sb_2$, $Ni_5Sb_2$ and $CeSb_3$ and $NiSb_3$ (6) Plumbides CePb, $Gd_5Pb_3$, $La_5Pb_3$ and $Dy_5Pb_4$, where, in the substance classes (1) to (6), up to 10 atom % of the elements may be replaced by Na, K, Rb, Cs, Zn, Cd, Al, Ga, Zr, Mg, S, Cu, Ag, Au, Ti, V, Nb, Ta, Cr, Mo, W, Mn, Re, Fe, Co, Ni or mixtures thereof, providing they are not already present in the combinations.

(7) Semiconductor oxides $UO_2$, $Bi_2O_3$, $CuO$, $Cu_2O$, $SnO$, $PbO$, $ZnO$, $In_2O_3$, $WO_3$, $V_2O_5$, $Sb_2O_3$, $CoO$, $NiO$, $Ce_2O_4$, $FeO$, $Fe_2O_3$, $NbO_2$, $CeO_2$ and $BaO$, where up to 10 mol % of the oxides may be replaced by $Na_2O$, $K_2O$, $CdO$, $SrO$, $Al_2O_3$, $Ga_2O_3$, $Cr_2O_3$ or mixtures thereof. The semiconductor material is preferably a binary or ternary alloy from one of the substance classes (1) to (6) or a binary oxide from the substance class (7), where no oxides or elements are replaced as stated. According to another procedure, thermoelectrically active materials may be prepared by combining and reacting from 30 to 50% by weight, preferably from 35 to 40% by weight, of one or more of the semiconductor-forming elements B, Si, Ge, Sb, Bi, S, Se and Te with from 50 to 70% by weight, preferably from 60 to 65% by weight, of one or more of the elements Mg, Al, Fe, Ni, Co, Zn, Cd, Ti, Zr, Y, Cu, V, Mo, W, Mn, Nb, Ta and U. As described hereinafter, these materials are combined in a suitable combinatorial manner followed by reaction of the elemental mixtures at elevated temperatures to give the actual thermoelectrically active materials by solid state reaction.

The doping element content in the alloy is up to 0.1 atom % or from $10^{18}$ to $10^{20}$ charge carriers per cubic centimeter. Higher charge carrier concentrations result in disadvantageous recombinations and thus in a reduced charge mobility. Doping is achieved by means of elements which give rise to an excess or deficiency of electrons in the crystal lattice, for example by means of iodide for n-type semiconductors and by means of alkaline earth elements for p-type semiconductors, provided the semiconductor is a 3/5 or 3/6 semiconductor.

Another possibility of doping is controlled introduction of holes or electrons into the materials by means of substoichiometric or superstoichiometric compositions, removing the need for an additional doping step.

Doping elements may also be introduced by means of aqueous solutions of metal salts which are subsequently dried in the mixture. The metal cations are then reduced, for example with hydrogen at elevated temperatures, or they remain in the material without reduction. Preferably, p-type doping or n-type doping is achieved by selecting the mixing ratios of the compounds or p-type doping is achieved by means of alkali metals and n-type doping is achieved by means of Sb, Bi, Se, Te, Br or I (see WO 92/13811).

It is advantageous to use heavy elements which are known to have a low thermal work function. In particular, these are known to be U, Bi, Se, Te, Ce and Ba.

DETAILED DESCRIPTION OF THE INVENTION

Materials according to the invention are formed by combining at least two compounds of the abovementioned substance classes. The binary parent compounds are characterized by high melting points, congruent melts and comparatively high Seebeck coefficients. Furthermore, they all have semiconductor properties such as an increase in electrical conductivity when the temperature is increased.

These binary compounds are used in combinatorial synthesis and testing to achieve thermoelectric materials having a high Z value from their combinations.

It has now been found that the following binary alloys are attractive, preferably as a base for thermoelectric materials having a high Z and high operating temperature:

| Material | Melting point (° C.) |
|---|---|
| $UB_2$ | 2385 |
| $UB_4$ | 2495 |
| $UB_{12}$ | 2235 |
| $U_5Ge_3$ | 1670 |
| $USb$ | 1850 |
| $U_3Si_5$ | 1770 |
| $USe$ | 1990 |
| $UTe$ | 1740 |
| $BaGe$ | 1145 |
| $BaSe$ | 1780 |
| $BaSi_2$ | 1180 |

Further suitable binary materials having a high temperature stability (melting points in ° C. given in brackets) are the germanides GdGe (1790), $Dy_5Ge_3$ (1825), $Er_5Ge_3$ (1950); the antimonides GdSb (2130), LaSb (1690), NdSb (2100), PrSb (2170), DySb (2170); the plumbides CePb (1380), $Gd_5Pb_3$ (1670), $La_5Pb_3$ (1450), $Dy_5Pb_4$ (1695); the suicides GdSi (2100), $NdSi_2$ (1757); the selenides GdSe (2170), LaSe (1950), $Nd_3Se_4$, $Nd_2Se_3$, PrSe (2100), ErSe (1630); the tellurides GdTe (1825), LaTe, (1720), NaTe (2025), PrTe (1950), SmTe (1910), DyTe (1850), ErTe (1790) and the sulfides LaS (2300), NdS (2200), $Pr_2S_3$ (1795) and DyS (2370).

Furthermore:

| | |
|---|---|
| $CeB_6$ | 2550 |
| $Ce_3Ge_5$ | 1513 |
| $CeSb$ | 1800 |
| $CeSi_2$ | 1430 |
| $CeTe$ | 1820 |
| $Ce_4Bi_3$ | 1740 |
| $CePb$ | 1380 |

The following preferred ternary materials are derived from these materials, where x is from 0.01 to 0.99, preferably from 0.05 to 0.95:

$U_{1+4x}B_{2-2x}Ge_{3x}$ $USb_xB_{2-2x}$ $U_{1+2x}B_{2-2x}Si_{5-x}$ $UB_{2-2x}Si_x$ $UB_{2-2x}Te_x$ $U_xBa_{1-x}Se$ $(U_xBa_{1+x})_5Ge_{5-2x}$ $(U_xBa_{1+x})_5Si_{6-x}$ $U_xCe_{1-x}B_{6+6x}$ $U_{5-5x}Ce_{3x}Ge_{3+2x}$ $U_xCe_{1-x}Sb$ $U_{3-3x}Ce_xSi_{5-3x}$ $U_xCe_{1-x}Te$ $U_{3-2x}Si_{5-5x}Se_x$ $U_{3-2x}Si_{5-5x}Te_x$ $U_{3-3x}Ba_xSi_{5-3x}$ $USb_xTe_{1-x}$ $USb_xSe_{1-x}$ $USe_xTe_{1-x}$ $U_xBa_{1-x}Se$ $U_xCe_{1-x}Te$ $Ba_xCe_{3-3x}Ge_{5-4x}$ $BaSe_xSi_{2-2x}$
$BaCe_{1-x}Si_2$
$Se_xGe_{1-x}Ba$
$Se_xSi_{2-2x}Ba$
$(U_xGd_{1+x})_5Ge_{5-2x}$
$(U_xDy_{1-x})_5Ge_3$
$(U_xEr_{1-x})_5Ge_3$
$U_xGd_{1-x}Sb$
$U_xLa_{1-x}Sb$
$U_xNd_{1-x}Sb$
$U_xPr_{1-x}Sb$
$U_xDy_{1-x}Sb$
$U_{3-3x}Gd_xSi_{5-4x}$
$U_{3-3x}Nd_xSi_{5-3x}$
$U_{3-3x}Pr_xSi_{5-3x}$
$U_xGd_{1-x}Se$
$U_xLa_{1-x}Se$
$U_{3-3x}Nd_{3x}Se_{x+3}$
$U_xPr_{1-x}Se$
$U_xEr_{1-x}Se$
$U_xGd_{1-x}Te$
$U_xLa_{1-x}Te$
$U_xNd_{1-x}Te$
$U_xPr_{1-x}Te$
$U_xSm_{1-x}Te$
$U_xDy_{1-x}Te$
$U_xEr_{1-x}Te$
$Ba_xGd_{1-x}Ge$
$Ba_{1-x}Dy_{5x}Ge_{2x+1}$
$Ba_{1-x}Er_{5x}Ge_{2x+1}$
$Ba_xGd_{1-x}Se$
$Ba_xLa_{1-x}Se$
$Ba_{1-x}Nd_{3x}Se_{3x+1}$
$Ba_{1-x}Nd_{2x}Se_{2x+1}$
$Ba_xPr_{1-x}Se$
$Ba_xEr_{1-x}Se$
$Ba_xGd_{1-x}Si_{x+1}$
$Ba_xNd_{1-x}Si_2$
$Ba_xPr_{1-x}Si_2$
$Ce_{3x}Gd_{1-x}Ge_{4x+1}$
$Ce_{3-3x}Dy_{5x}Ge_{5-2x}$
$Ce_{3-3x}Er_{5x}Ge_{5-2x}$
$Ce_xGd_{1-x}Sb$
$Ce_xLa_{1-x}Sb$
$Ce_xNd_{1-x}Sb$
$Ce_xPr_{1-x}Sb$
$Ce_xDy_{1-x}Sb$
$Ce_xGd_{5-5x}Pb_{3-2x}$
$Ce_xLa_{5-5x}Pb_{3-2x}$
$Ce_xDy_{5-5x}Pb_{4-3x}$
$Ce_xGd_{1-x}Si_{x+1}$
$Ce_xNd_{1-x}Si_2$
$Ce_xPr_{1-x}Si_2$
$Gd_xDy_{5-5x}Ge_{3-2x}$
$Gd_xEr_{5-5x}Ge_{3-2x}$
$Gd_xLa_{1-x}Sb$
$Gd_xNd_{1-x}Sb$
$Gd_xPr_{1-x}Sb$
$Gd_xDy_{1-x}Sb$
$Gd_xDy_{1-x}Sb$
$(Gd_xLa_{1-x})_5Pb_3$
$(Gd_xDy_{1-x})_5Pb_{4-x}$
$Gd_xNd_{1-x}Si_{2-x}$
$Gd_xPr_{1-x}Si_{2-x}$
$Gd_xLa_{1-x}Se$
$Gd_{1-x}Nd_{3x}Se_{3x+1}$
$Gd_{1-x}Nd_{2x}Se_{2x+1}$
$Gd_xPr_{1-x}Se$
$Gd_xEr_{1-x}Se$
$Gd_xLa_{1-x}Te$
$Gd_xNd_{1-x}Te$
$Gd_xPr_{1-x}Te$
$Gd_xSm_{1-x}Te$
$Gd_xDy_{1-x}Te$
$Gd_xEr_{1-x}Te$
$La_xNd_{1-x}Sb$
$La_xPr_{1-x}Sb$
$La_xDy_{1-x}Sb$
$(La_xDy_{1-x})_5Pb_{4-x}$
$La_{1-x}Nd_{3x}Se_{3x+1}$
$La_{1-x}Nd_{2x}Se_{2x+1}$
$La_xPr_{1-x}Se$
$La_xEr_{1-x}Se$
$La_xNd_{1-x}Te$
$La_xPr_{1-x}Te$
$La_xEr_{1-x}Te$
$La_xDy_{1-x}Te$
$La_xSm_{1-x}Te$
$La_xNd_{1-x}S$
$La_xDy_{1-x}S$
$La_{1-x}Pr_{2x}S_{2x+1}$
$Nd_xPr_{1-x}Sb$
$Nd_xDy_{1-x}Sb$
$Nd_xPr_{1-x}Si_2$
$Pr_{1-x}Nd_{3x}Se_{3x+1}$
$Pr_{1-x}Nd_{2x}Se_{2x+1}$
$Er_{1-x}Nd_{3x}Se_{3x+1}$
$Er_{1-x}Nd_{2x}Se_{2x+1}$
$Nd_xPr_{1-x}Te$
$Nd_xSm_{1-x}Te$
$Nd_xDy_{1-x}Te$
$Nd_xEr_{1-x}Te$
$Nd_xDy_{1-x}S$
$Nd_{1-x}Pr_{2x}S_{2x+1}$
$Pr_xDy_{1-x}Sb$
$Pr_xEr_{1-x}Se$
$Pr_xSm_{1-x}Te$
$Pr_xDy_{1-x}Te$
$Pr_xEr_{1-x}Te$
$Pr_{2x}Dy_{1-x}S_{2x+1}$
$Sm_xDy_{1-x}Te$
$Sm_xEr_{1-x}Te$ $(Dy_xEr_{1-x})_5Ge_3$ $Dy_xEr_{1-x}Te$

Particularly inexpensive thermoelectric materials are semiconductor silicides and borides having high Si or B content in the form of $MeSi_x$ where $x \geq 1$ and $MeB_x$ where $x \geq 1$ These materials are p-doped with alkali metal salts or n-doped with Sb, Bi, Se, Te, Br or J.

Thus, preferred binary silicides according to the invention are:

$BaSi_2$ $CoSi$ $CoSi_2$ $CrSi_2$ $FeSi$ $FeSi_2$ $MnSi$ $MoSi_2$ $WSi_2$ $VSi_2$ $FeSi_{1+x}$ x=0–1

$CoSi_{1+x}$ x=0–1

Preferred binary borides according to the invention are:

$AlB_{12}$ $CoB$ $CrB_2$ $CrB_4$ $FeB$ $MnB$ $MnB_2$ $Mn\,B_4$ $MNB_{12}$ $MoB\ Mo\ B_4$ $SiB_6$ $SiB_4$ $SiBi_2$ $TiB_2$ $VB_2$ $YB_4$ $ZrB_2$ $CuB_{24}$ $NiB_{12}$ $BaB_6$ $MgB_2$ $MgB_4$ $MgB_{12}$ $UB_2$ $UB_4$ $UB_{12}$

The following preferred ternary suicides and borides are derived from the abovementioned suicides and borides, where x is between 0.01 and 0.99:

Ternary Silicides $Al_3SiB_{48}$ $Al_4SiC_4$ $Al_4Si_3C_6$ $Ba_xCo_{1-x}Si_{1+x}$ $Ba_xCo_{1-x}Si_2$ $Ba_xCr_{1-x}Si_2$ $Ba_xFe_{1-x}Si_{1+x}$ $Ba_xMn_{1-x}Si_{1+x}$ $Ba_xMo_{1-x}Si_2$ $Ba_xW_{1-x}Si_2$ $Co_{1-x}Cr_xSi_{1+x}$ $Co_xFe_{1-x}Si$ $Co_xMn_{1-x}Si$ $Co_{1-x}Mo_xSi_{1+x}$ $Co_{1-x}W_xSi_{1+x}$ $Co_xCr_{1-x}Si_2$ $Co_xFe_{1-x}Si_{1+x}$ $Co_xMn_{1-x}Si_{1+x}$ $Co_xMo_{1-x}Si_2$ $Co_xW_{1-x}Si_2$ $Cr_xFe_{1-x}Si_{1+x}$ $Cr_xMn_{1-x}Si_{1+x}$ $Cr_xMo_{1-x}Si_2$ $Cr_xW_{1-x}Si_2$ $Fe_xMn_{1-x}Si$ $Fe_{1-x}Mo_xSi_{1+x}$ $Fe_{1-x}W_xSi_{1+x}$ $Mn_{1-x}W_xSi_{1+x}$ $Mo_xW_{1-x}Si_2$ $Fe_xBa_{1-x}Si_2$ $Fe_xCo_{1-x}Si_{1+x}$ $Fe_xCo_{1-x}Si_2$ $Fe_xCr_{1-x}Si_2$ $Fe_xMn_{1-x}Si_{1+x}$ $Fe_xMo_{1-x}Si_2$ $Fe_xW_{1-x}Si_2$ $Fe_xV_{1-x}Si_2$ $V_xBa_{1-x}Si_2$ $V_xCo_{1-x}Si_{1+x}$ $V_xCo_{1-x}Si_2$ $V_xCr_{1-x}Si_2$ $V_xFe_{1-x}Si_{1+x}$ $V_xMn_{1-x}Si_{1+x}$ $V_xMo_{1-x}Si_2$ $V_xW_{1-x}Si_2$ $U_{3-3x}Co_xSi_{5-4x}$ $U_{3-3x}CO_xSi_{5-3x}$ $U_{3-3x}Cr_xSi_{5-3x}$ $U_{3-3x}Fe_xSi_{5-4x}$ $U_{3-3x}Fe_xSi_{5-3x}$ $U_{3-3x}Mn_xSi_{5-4x}$ $U_{3-3x}Mo_xSi_{5-3x}$ $U_{3-3x}W_xSi_{5-3x}$ $U_{3-3x}V_xSi_{5-3x}$ Ternary Borides $Co_xMn_{1-x}B$ $Co_xFe_{1-x}B$ $Fe_xMn_{1-x}B$ $Co_xCr_{1-x}B_2$ $Cr_xMn_{1-x}B_2$ $Co_xMn_{1-x}B_2$ $Cr_xTi_{1-x}B_2$ $Cr_xZr_{1-x}B_2$ $Co_xZr_{1-x}B_2$ $Mn_xZr_{1-x}B_2$
$Co_xV_{1-x}B_2$
$Cr_xV_{1-x}B_2$
$Mn_xV_{1-x}B_2$
$Ti_xV_{1-x}B_2$
$Zr_xV_{1-x}B_2$
$Mn_xTi_{1-x}B_2$
$Cr_xMg_{1-x}B_4$
$Cr_xMn_{1-x}B_4$
$Cr_xMo_{1-x}B_4$
$Cr_xSi_{1-x}B_4$
$Cr_xY_{1-x}B_4$
$Mg_xMn_{1-x}B_4$
$Mg_xMo_{1-x}B_4$
$Mg_xSi_{1-x}B_4$
$Mg_xY_{1-x}B_4$
$Mn_xMo_{1-x}B_4$
$Mn_xSi_{1-x}B_4$
$Mn_xY_{1-x}B_4$
$Mo_xSi_{1-x}B_4$
$Mo_xY_{1-x}B_4$
$Si_xY_{1-x}B_4$
$Al_3B_{44}C_2$
$Al_8B_4C_7$
$AlB_{12}C_2$
$Al_4B_4C_x$
$Al_8B_7C_4$
$Al_3B_{48}C_2$
$Mg_{0.78}Al_{0.75}B_{14}$
$MgAlB_{14}$
$U_xAl_{1-x}B_{12-10x}$
$U_xCo_{1-x}B_{1+x}$
$U_xCr_{1-x}B_2$
$U_xFe_{1-x}B_{1+x}$
$U_xMn_{1-x}B_{1+x}$
$U_xMn_{1-x}B_2$
$U_xMo_{1-x}B_{1+x}$
$U_xSi_{1-x}B_{6-4x}$
$U_xSi_{1-x}B_{4-2x}$
$U_xSi_{1-x}B_{12-10x}$
$U_xTi_{1-x}B_2$
$U_xV_{1-x}B_2$
$U_xY_{1-x}B_{4-2x}$
$U_xZr_{1-x}B_2$
$U_xCu_{1-x}B_{24-22x}$
$U_xNi_{1-x}B_{12-10x}$
$U_xBa_{1-x}B_{6-2x}$
$U_xCr_{1-x}B_{4-2x}$
$U_xMg_{1-x}B_2$
$U_xMg_{1-x}B_{4-2x}$
$U_xMg_{1-x}B_{12-10x}$
$U_xMn_{1-x}B_{4-2x}$
$U_xMo_{1-x}B_{4-2x}$
$U_xMn_{1-x}B_{12-10x}$
$U_xAl_{1-x}B_{12-8x}$
$U_xCo_{1-x}B_{1+3x}$
$U_xCr_{1-x}B_{2+2x}$
$U_xFe_{1-x}B_{1+3x}$
$U_xMn_{1-x}B_{1+3x}$
$U_xMn_{1-x}B_{2+2x}$
$U_xMo_{1-x}B_{1+3x}$
$U_xSi_{1-x}B_{6-2x}$
$U_xSi_{1-x}B_4$
$U_xSi_{1-x}B_{12-8x}$
$U_xTi_{1-x}B_{2+2x}$
$U_xV_{1-x}B_{2+2x}$
$U_xY_{1-x}B_4$
$U_xZr_{1-x}B_{2+2x}$
$U_xCU_{1-x}B_{24-20x}$
$U_xNi_{1-x}B_{12-8x}$
$U_xBa_{1-x}B_{6-2x}$
$U_xCr_{1-x}B_4$
$U_xMg_{1-x}B_{2+2x}$
$U_xMg_{1-x}B_4$
$U_xMg_{1-x}B_{12-8x}$
$U_xMn_{1-x}B_4$
$U_xMo_{1-x}B_4$
$U_xMn_{1-x}B_{12-8x}$
$U_xAl_{1-x}B_{12}$
$U_xCo_{1-x}B_{11x+1}$
$U_xCr_{1-x}B_{10x+2}$
$U_xFe_{1-x}B_{11x+1}$
$U_xMn_{1-x}B_{11x+1}$
$U_xMn_{1-x}B_{10x+2}$
$U_xMo_{1-x}B_{11x+1}$
$U_xSi_{1-x}B_{6x+6}$
$U_xSi_{1-x}B_{8x+4}$
$U_xSi_{1-x}B_{12}$
$U_xTi_{1-x}B_{10x+2}$
$U_xV_{1-x}B_{10x+2}$
$U_xY_{1-x}B_{8x+4}$
$U_xZr_{1-x}B_{10x+2}$
$U_xCu_{1-x}B_{24-12x}$
$U_xNi_{1-x}B_{12}$
$U_xBa_{1-x}B_{6x+6}$
$U_xCr_{1-x}B_{8x+4}$
$U_xMg_{1-x}B_{10x+2}$
$U_xMg_{1-x}B_{8x+4}$
$U_xMg_{1-x}B_{12}$
$U_xMn_{1-x}B_{8x+4}$
$U_xMo_{1-x}B_{8x+4}$
$U_xMn_{1-x}B_{12}$ The silicides and borides according to the invention may additionally contain up to 20 atom % of the elements Fe, Co, Ni, Mn, Mo and Al in combination with the other elements cited hereinbefore.

It is also possible to alloy the binary and ternary alloys with up to 10 atom % of other elements, i.e. Na, K, Rb, Cs, Zn, Cd, Al, Ga, In, Sn, Zr, Hf, S, Cu, Ag, Au, Ti, V, Nb, Ta, Cr, Mo, W, Mn, Re, Fe, Co or Ni.

The conditions for high-efficiency thermoelectric materials are also satisfied by preferred binary oxides (7) which are essentially derived from the known semiconductor oxides $UO_2$, $Bi_2O_3$, $CuO$, $Cu_2O$, $SnO$, $PbO$, $ZnO$, $In_2O_3$. These are, with x being from 0.01 to 0.99, preferably from 0.05 to 0.95, $(In_xBi_{1-x})_2O_3$
$Ba_xSn_{1-x}O$
$U_xCe_{1-x}O_2$
$Ba_xU_{1-x}O_{2-x}$
$Sn_xU_{1-x}O_{2-x}$
$Pb_xU_{1-x}O_{2-x}$
$Cu_xU_{1-x}O_{2-x}$
$Zn_xU_{1-x}O_{2-x}$
$(In_xSb_{1-x})_2O_3$
$Cu_xPb_{1-x}O$
$(Bi_xSb_{1-x})_2O_3$
$In_{2x}U_{1-x}O_{2+x}$
$In_{2x}Ce_{1-x}O_{2+x}$
$In_{2x}Ba_{1-x}O_{1+2x}$
$In_{2x}Sn_{1-x}O_{1+2x}$
$In_{2x}Pb_{1-x}O_{1+2x}$
$In_{2x}Cu_{1-x}O_{1+2x}$
$In_{2x}Zn_{1-x}O_{1+2x}$
$Sb_{2x}Sn_{1-x}O_{1+2x}$
$Bi_{2x}Sn_{1-x}O_{1+2x}$
$Bi_{2x}Pb_{1-x}O_{1+2x}$
$Bi_{2x}Cu_{1-x}O_{1+2x}$
$Bi_{2x}Zn_{1-x}O_{1+2x}$
$Sb_{2x}Ba_{1-x}O_{1+2x}$
$Bi_{2x}Ba_{1-x}O_{1+2x}$
$Bi_{2x}U_{1-x}O_{2+x}$
$Sb_{2x}U_{1-x}O_{2+x}$
$Bi_{2x}Ce_{1-x}O_{2+x}$
$Sb_{2x}Ce_{1-x}O_{2+x}$
$Cu_xZn_{1-x}O$
$Sb_{2x}Zn_{1-x}O_{1+2x}$
$Sb_{2x}Cu_{1-x}O_{1+2x}$
$Sb_{2x}Pb_{1-x}O_{1+2x}$
$Pb_xZn_{1-x}O$
$Pb_xCe_{1-x}O_{2-x}$
$Cu_xCe_{1-x}O_{2-x}$
$Zn_xCe_{1-x}O_{2-x}$
$Sn_xCe_{1-x}O_{2-x}$
$Ba_xCe_{1-x}O_{2-x}$
$Sn_xZn_{1-x}O$
$Sn_xCu_{1-x}O$
$Ba_xZn_{1-x}O$
$Ba_xCu_{1-x}O$
$Ba_xPb_{1-x}O$
$Sn_xPb_{1-x}O$
$V_{2x}Cu_{2-2x}O_{1+4x}$
$V_{2x}W_{1-x}O_{3+2x}$
$V_{2x}Cu_{1-x}O_{1+4x}$
$V_{2x}Zn_{1-x}O_{1+4x}$
$V_{2x}Ce_{1-x}O_{2+3x}$
$V_{2x}Sn_{1-x}O_{2+3x}$
$V_{2x}Ba_{1-x}O_{1+4x}$
$(V_xSb_{1-x})_2O_{3+2x}$
$(V_xBi_{1-x})_2O_{3+2x}$
$(V_xIn_{1-x})_2O_{3+2x}$
$V_{2x}U_{1-x}O_{2+3x}$
$V_{2x}Co_{1-x}O_{1+4x}$
$V_{2x}Ni_{1-x}O_{1+4x}$
$W_xCu_{2-2x}O_{1+2x}$
$W_xCu_{1-x}O_{1+2x}$
$W_xPb_{1-x}O_{1+2x}$
$W_xCe_{1-x}O_{2+x}$
$W_xSn_{1-x}O_{2+x}$
$W_xBa_{1-x}O_{1+2x}$
$W_xBi_{2-2x}O_3$
$W_xSb_{2-2x}O_3$
$W_xU_{1-x}O_{2+x}$
$W_xIn_{2-2x}O_3$
$W_xCo_{1-x}O_{1+2x}$
$W_xNi_{1-x}O_{1+2x}$
$Co_xNi_{1-x}O$
$Co_xCu_{2-2x}O$
$Co_xCu_{1-x}O$
$Co_xPb_{1-x}O$
$Co_xZn_{1-x}O$
$Co_xCe_{1-x}O_{2-x}$
$Co_xSn_{1-x}O_{2-x}$
$Co_xBa_{1-x}O$
$Co_xSb_{2-2x}O_{3-2x}$
$Co_xBi_{2-2x}O_{3-2x}$
$Co_xU_{1-x}O_{2-x}$
$Ni_xCu_{2-2x}O$
$Ni_xCu_{1-x}O$
$Ni_xPb_{1-x}O$
$Ni_xZn_{1-x}O$
$Ni_xCe_{1-x}O_{2-x}$
$Ni_xSn_{1-x}O_{2-x}$
$Ni_xBa_{1-x}O$
$Ni_xSb_{2-2x}O_{3-2x}$
$Ni_xBi_{2-2x}O_{3-2x}$
$Ni_xIn_{2-2x}O_{3-2x}$
$Ni_xU_{1-x}O_{2-x}$ In these materials, Ce may be partially or completely replaced by the lanthanides Gd, La, Nd, Pr, Sm, Dy or Er or mixtures thereof.

The binary oxides may comprise up to 10 mol % of further oxides. Such oxides are $Na_2O$, $K_2O$, CdO, SrO, $Al_2O_3$, $Ga_2O_3$, $Cr_2O_3$, $WO_3$, FeO, $Fe_2O_3$, CoO and NiO.

The semiconductor material is preferably selected from silicides (1) and borides (2), the Si content or B content being at least 50 atom %. The invention also provides the above-described semiconductor material. The invention also provides a process for preparing these semiconductor materials by sintering or melting together and subsequently sintering mixtures of the elemental powders or by sintering mixtures of the oxide powders.

Thus, the materials of the invention are prepared by known methods, the elemental compounds for example by sintering of the elemental powders at high temperatures, but below the melting point, or by arc melting under a high vacuum followed by pulverizing and sintering. The oxides are synthesized, for example, by sintering of the powder mixtures of the individual oxides. The term "combination" as used hereinbefore refers to exactly this preparation, in particular the sintering.

The thermoelectrically active mixed oxides can also be prepared by reactive sintering of the appropriate metal mixtures in air at elevated temperatures. It is also appropriate for economic reasons to use mixtures of oxides and metals. Metals which are very reactive and therefore expensive and difficult to handle, such as U, Ba or Ce, will be employed in the form of $UO_2$, BaO or $CeO_2$, likewise Na in the form of $Na_2O$, $Na_2CO_3$ or NaOH, K in the form of $K_2O$ or KOH or $K_2CO_3$, Sr in the form of SrO or $SrCO_3$, Ga in the form of $Ga_2O_3$.

The invention further provides for optimizing the materials in terms of efficiency. It is obvious that variation of the components, for example by 5 atom %, requires preparation and testing of very many materials. This object can be achieved by means of combinatorial methods. To this end, elemental alloys or oxide mixtures or mixtures of elements and oxides may be produced on a substrate with gradual variation of the composition as a function of the length coordination by producing the elements or already binary alloys from appropriate targets on a substrate provided with a perforated mask, where the elemental composition varies depending on the distance to the targets or depending on the sputtering angle. The mask is then removed, and the resulting dots are sintered to give the actual materials. The term "dot" refers to spatially separate points or areas of the material on a substrate which have essentially identical dimensions and are preferably arranged at regular intervals so as to produce an array. An "array" refers to the two dimensional, essentially equally spaced arrangement of dots on a substrate surface. It is also possible to suspend elemental powders and oxide powders having particle sizes of less than 5 $\mu$m in an inert suspension agent, such as hydrocarbons, with the assistance of a dispersant to give sufficiently stable suspensions and to deposit mixtures of the suspensions, as described for the oxides, in the form of droplets, evaporate the suspending agent and sinter the resulting powder mixtures on the substrate.

Preferred inert, temperature- and diffusion-stable substrate materials are metallic substrates as well as silicon carbide which likewise has a sufficient electrical conductivity.

Dots of the oxides may be produced on a substrate surface by depositing, via metering devices, mixtures of salts, preferably of nitrates or other soluble compounds, in the form of droplets of varying composition, evaporating the solvent, preferably water, converting the nitrates or compounds into the oxides by increasing the temperature and subsequently sintering the oxide mixtures as a whole. From 1000 to 10,000 dots having a dimension (diameter) of from 0.2 to 2 mm are deposited on a substrate plate of dimensions in the order of 10×10 cm.

Quick and reliable testing of the materials is essential. To this end, two analysis methods can be carried out according to the invention:

The invention provides a process for combinatorial preparation and testing of semiconductor materials for thermoelectric generators, which comprises producing an array of dots of the semiconductor materials of different composition on a conductive sheet-like substrate, bringing the substrate carrying the array to a desired measuring temperature, preferably under an inert gas such as nitrogen or argon, and contacting each of the dots with a cooled measuring pin, the voltage without load, current and voltage at decreasing load resistance and/or short-circuit current being measured, subsequently stored and analyzed. The material samples have the same temperature as the substrate plate from the outset, so that a temperature gradient is produced only on lowering the cooled measuring pin, which gradient increases within seconds and gives rise to a short-circuit current which varies depending on the temperature difference. This current is measured and its profile is stored. The invention furthermore provides a process for combinatorial preparation and testing of semiconductor materials for thermoelectric generators, which comprises producing an array of dots of the semiconductor materials of different composition on a conductive sheet-like substrate, contacting the dots on the side located opposite the substrate with a conductive nonmagnetic plate and maintaining the substrate and the plate at different temperatures and electrically connecting them, the plate being scanned by means of a magnetic field probe and measuring data being stored and analyzed.

For both methods, the dots on the metallic or silicon carbide substrate are abraded, for example by means of a microabrasive disk, to a uniform height, simultaneously creating a flat surface of low roughness depth. The substrate plate is brought to a measuring temperature and the dots are contacted with a cooled measuring pin at a defined contact force.

Conversely, it is also possible to leave the substrate plate cold and to heat the measuring pin. In this case, the pin should not be heated electrically, but by purely thermal means, for example by focusing an infrared laser onto the measuring device in an appropriate manner, to prevent the coupling of unwanted currents.

While the measuring pin is in contact with the dot, the voltage without load, current and voltage at decreasing load resistance and the short-circuit current are measured. A computer-controlled measuring apparatus requires about 10 seconds to measure one material including repositioning to the next dot, which makes it possible to measure about 10 000 dots at one temperature per day. If several measuring pins are used in parallel, the number of dots that can be measured increases accordingly. The measurement values and curves may be stored and graphically prepared so that a graphical representation indicates the better materials at a glance, the composition of which is then analyzed in accordance with conventional methods. Preference is given to working under inert gas.

Another, however contactless, testing and analysis variant comprises depositing a further conductive nonmagnetic cooled plate on the dots on the conductive or metallic substrate plate and electrically connecting the two plates. At the prevailing temperature difference, each dot is short-circuited. The short-circuit current induces local magnetic fields in the dots and the surrounding plate areas. The plate is scanned by means of a magnetic field probe, for example a Hall probe or a Squid, and the measuring values are stored as a function of the coordinates in a computer. The strength of the magnetic field is proportional to the short-circuit current, and its direction indicates whether the material is p-conducting or n-conducting. The corresponding graphic preparation of the measuring values indicates the particularly advantageous dots at a glance.

This method allows the measurement of 10 000 dots in the course of from 5 to 30 min., however only in terms of doping and short-circuit current.

The invention also provides an array consisting of at least 10 different semiconductor materials on a conductive substrate.

The materials of the invention are incorporated in modules and connected in series in these modules in accordance with the state of the art, as described, for example, in WO 98/44562, U.S. Pat. No. 5,448,109 or U.S. Pat. No. 5,439,528.

What is claimed is:
1. A thermoelectric generator comprising a p-doped or n-doped semiconductor material, wherein said semiconduc- tor material is at least one ternary material selected from one of the following substance classes and formed by combining at least 2 compounds of the substance class:
(1) Silicides
    $U_3Si_5$, $BaSi_2$, $CeSi_2$, $GdSi$, $NdSi_2$, $CoSi$, $CoSi_2$, $CrSi_2$, $FeSi$, $FeSi_2$, $MnSi$, $MoSi_2$, $WSi_2$, $VSi$, $TiSi_2$, $ZrSi_2$, $VSi_2$, $NbSi_2$ and $TaSi_2$
(2) Borides
    $UB_2$, $UB_4$, $UB_{12}$, $CeB_6$, $AlB_{12}$, $CoB$, $CrB_2$, $CrB_4$, $FeB$, $MnB$, $MnB_2$, $MnB_{12}$, $MoB$, $MoB_4$, $SiB_4$, $SiB_6$, $SiB_{12}$, $TiB_2$, $VB_2$, $YB_4$, $ZrB_2$, $CuB_{24}$, $NiB_{12}$, $BaB_6$, $MgB_2$, $MgB_4$ and $MgB_{12}$, where the aluminum-containing borides may additionally contain one carbon atom per boron atom,
(3) Germanides
    $U_5Ge_3$, $BaGe$, $GdGe$, $Dy_5Ge_3$, $Fr_5Ge_3$ and $Ce_3Ge_5$
(4) Tellurides, sulfides and selenides
    $LaS$, $NdS$, $Pr_2S_3$, $DyS$, $USe$, $BaSe$, $GdSe$, $LaSe$, $Nd_3Se_4$, $Nd_2Se_3$, $PrSe$, $FrSe$, $UTe$, $GdTe$, $LaTe$, $NdTe$, $PrTe$, $SmTe$, $DyTe$ and $ErTe$
(5) Antimonides
    $USb$, $CeSb$, $GdSb$, $LaSb$, $NdSb$, $PrSb$, $DySb$, $AlSb$, $CeSb$, $CrSb$, $FeSb$, $Mg_3Sb_2$, $Ni_5Sb_2$, $CeSb_3$ and $NiSb_3$
(6) Plumbides
    $CePb$, $Gd_5Pb_3$, $La_5Pb_3$ and $Dy_5Pb_4$,
where, in the substance classes (1) to (6), up to 10 atom % of the elements may be replaced by Na, K, Rb, Cs, Zn, Cd, Al, Ga, Zr, Mg, S, Cu, Ag, Au, Ti, V, Nb, Ta, Cr, Mo, W, Mn, Re, Fe, Co, Ni or mixtures thereof, providing they are not already present in the combinations,
(7) Semiconductor oxides
    $UO_2$, $Bi_2O_3$, $CuO$, $Cu_2O$, $SnO$, $PbO$, $ZnO$, $In_2O_3$, $WO_3$, $V_2O_5$, $Sb_2O_3$, $CoO$, $NiO$, $Ce_2O_4$, $FeO$, $Fe_2O_3$, $NbO_2$, $CeO_2$ and $BaO$,
where up to 10 mol % of the oxides may be replaced by $Na_2O$, $K_2O$, $CdO$, $SrO$, $Al_2O_3$, $Ga_2O_3$, $Cr_2O_3$ or mixtures thereof, and
wherein ternary suicides formed by combining $CrSi_2$ and $FeSi_2$ are of formula

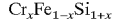

wherein x is from 0.01 to 0.99.

2. A thermoelectric generator as claimed in claim 1, wherein the semiconductor material is a binary or ternary alloy from one of the substance classes (1) to (6) or a binary oxide from the substance class (7), where no oxides or elements are replaced as stated.

3. A thermoelectric generator as claimed in claim 1, wherein p-type doping or n-type doping is achieved by selecting the mixing ratios of the compounds or p-type doping is achieved by means of alkali metals and n-type doping is achieved by means of Sb, Bi, Se, Te, Br or I.

4. A thermoelectric generator as claimed in claim 1, wherein the semiconductor material is selected from the group consisting of silicides (1) and borides (2), the Si content or B content being at least 50 atom %.

5. A thermoelectric generator comprising a p-doped or n-doped semiconductor material, wherein the semiconductor material is formed by combining and reacting from 30 to 50% by weight of one or more of semiconductor-forming elements selected from the group consisting of B, Si, Ge, Sb, Bi, S, Se and Te with from 50 to 70% by weight of one or more elements selected from the group consisting of Al, Fe, Ni, Co, Zn, Cd, Ti, Zr, Y, Cu, V, Mo, W, Mn, Nb, Ta and U.

6. A semiconductor material wherein said semiconductor material is at least one ternary material selected from one of the following substance classes and formed by combining at least 2 compounds of the substance class:
(1) Silicides
    $U_3Si_5$, $BaSi_2$, $CeSi_2$, $GdSi$, $NdSi_2$, $CoSi$, $CoSi_2$, $CrSi_2$, $FeSi$, $FeSi_2$, $MnSi$, $MoSi_2$, $WSi_2$, $VSi$, $TiSi_2$, $ZrSi_2$, $VSi_2$, $NbSi_2$ and $TaSi_2$
(2) Borides
    $UB_2$, $UB_4$, $UB_{12}$, $CeB_6$, $AlB_{12}$, $CoB$, $CrB_2$, $CrB_4$, $FeB$, $MnB$, $MnB_2$, $MnB_{12}$, $MoB$, $MoB_4$, $SiB_4$, $SiB_6$, $SiB_{12}$, $TiB_2$, $VB_2$, $YB4$, $ZrB_2$, $CuB_{24}$, $NiB_{12}$, $BaB_6$, $MgB_2$, $MgB_4$, and $MgB_{12}$, wherein the aluminum-containing borides may additionally contain one carbon atom per boron atom,
(3) Germanides
    $UCGe_3$, $BaGe$, $GdGe$, $Dy_5Ge_3$, $Fr_5Ge_3$ and $Ce_3Ge_5$
(4) Tellurides, sulfides, and selenides
    $LaS$, $NdS$, $Pr_2S_3$, $DyS$, $USe$, $BaSe$, $GdSe$, $LaSe$, $Nd_3Se_4$, $Nd_2Se_3$, $PrSe$, $FrSe$, $UTe$, $GdTe$, $LaTe$, $NdTe$, $PrTe$, $SmTe$, $DyTe$ and $ErTe$
(5) Antimonides
    $USb$, $CeSb$, $GdSb$, $LaSb$, $NdSb$, $PrSb$, $DySb$, $AlSb$, $CeSb$, $CrSb$, $FeSb$, $MN_3Sb_2$, $Ni_5Sb_2$, $CeSb_3$ and $NiSb_3$
(6) Plumbides
    $CePb$, $Gd_5Pb_3$, $La_5Pb_3$ and $Dy_5Pb_4$
wherein, in the substance classes (1) to (6), up to 10 atom % of the elements may be replaced by Na, K, Rb, Cs, Zn, Cd, Al, Ga, Zr, Mg, S, Cu, Ag, Au, Ti, V, Nb, Ta, Cr, Mo, W, Mn, Re, Fe, Co, Ni or mixtures thereof, providing they are not already present in the combination,
(7) Semiconductor oxides
    $UO_2$, $Bi_2O_3$, $CuO$, $Cu_2O$, $SnO$, $PbO$, $ZnO$, $In_2O_3$, $WO_3$, $V_2O_5$, $Sb_2O_3$, $CoO$, $NiO$, $Ce_2O_4$, $FeO$, $Fe_2O_3$, $NbO_2$, $CeO_2$ and $BaO$, where up to 10 mol % of the oxides may be replaced by $Na_2O$, $K_2O$, $CdO$, $SrO$, $Al_2O_3$, $Ga_2O_3$, $Cr_2O_3$ or mixtures thereof, and wherein the silicides formed by combining CrSi2 and FeSi2 are of formula

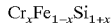

wherein x is form 0.01 to 0.99.

7. A process for the preparation of semiconductor materials as claimed in claim 6 by sintering or melting together and subsequently sintering mixtures of the elements in the form of elemental powders or by sintering mixtures of oxides of the elements in the form of powders.

8. A process for combinatorial preparation and testing of semiconductor materials for thermoelectric generators, wherein the semiconductor materials are ternary materials selected from one of the following substance classes and formed by combining at least 2 compounds of the substance class:
(1) Silicides
    $U_3Si_5$, $BaSi_2$, $CeSi_2$, $GdSi$, $NdSi_2$, $CoSi$, $CoSi_2$, $CrSi_2$, $FeSi$, $FeSi_2$, $MnSi$, $MoSi_2$, $WSi_2$, $VSi$, $TiSi_2$, $ZrSi_2$, $VSi_2$, $NbSi_2$ and $TaSi_2$
(2) Borides
    $UB_2$, $UB_4$, $UB_{12}$, $CeB_6$, $AlB_{12}$, $CoB$, $CrB_2$, $CrB_4$, $FeB$, $MnB$, $MnB_2$, $MnB_{12}$, $MOB$, $MoB_4$, $SiB_4$, $SiB_6$, $SiB_{12}$, $TiB_2$, $VB_2$, $YB_4$, $ZrB_2$, $CUB_{24}$, $NiB_{12}$, $BaB_6$, $MgB_2$, $MgB_4$ and $MgB_{12}$, where the aluminum-containing borides may additionally contain one carbon atom per boron atom, (3) Germanides U$_5$Ge$_3$, BaGe, GdGe, Dy$_5$Ge$_3$, Fr$_5$Ge$_3$ and Ce$_3$Ges (4) Tellurides, sulfides and selenides LaS, NdS, Pr$_2$S$_3$, DyS, USe, BaSe, GdSe, LaSe, Nd$_3$Se$_4$, Nd$_2$Se$_3$, PrSe, FrSe, UTe, GdTe, LaTe, NdTe, PrTe, SmTe, DyTe and ErTe (5) Antimonides USb, CeSb, GdSb, LaSb, NdSb, PrSb, DySb, AlSb, CeSb, CrSb, FeSb, Mg$_3$Sb$_2$, Ni$_5$Sb$_2$, CeSb$_3$ and NiSb$_3$ (6) Plumbides CePb, Gd$_5$Pb$_3$, La$_5$Pb$_3$ and Dy$_5$Pb$_4$, where, in the substance classes (1) to (6), up to 10 atom % of the elements may be replaced by Na, K, Rb, Cs, Zn, Cd, Al, Ga, Zr, Mg, S, Cu, Ag, Au, Ti, V, Nb, Ta, Cr, Mo, W, Mn, Re, Fe, Co, Ni or mixtures thereof, providing they are not already present in the combinations, (7) Semiconductor oxides UO$_2$, Bi$_2$O$_3$, CuO, Cu$_2$O, SnO, PbO, ZnO, In$_2$O$_3$, WO$_3$, V$_2$O$_5$, Sb$_2$O$_3$, CoO, NiO, Ce$_2$O$_4$, FeO, Fe$_2$O$_3$, NbO$_2$, CeO$_2$ and BaO, where up to 10 mol % of the oxides may be replaced by Na$_2$O, K$_2$O, CdO, SrO, Al$_2$O$_3$, Ga$_2$O3, Cr$_2$O$_3$ or mixtures thereof, which comprises producing an array of dots of the semiconductor materials of different composition on a conductive sheet substrate, bringing the substrate carrying the array to a desired measuring temperature and contacting each of the dots with a cooled measuring pin, the voltage without load, current and voltage at decreasing load resistance and/or short-circuit current being measured, subsequently stored and analyzed.

9. A process for combinatorial preparation and testing of semiconductor materials for thermoelectric generators, wherein the semiconductor materials are ternary materials selected from one of the following substance classes and formed by combining at least 2 compounds of the substance class:

(1) Silicides

U$_3$Si$_5$, BaSi$_2$, CeSi$_2$, GdSi, NdSi$_2$, CoSi, CoSi$_2$, CrSi$_2$, FeSi, FeSi$_2$, MnSi, MoSi$_2$, WSi$_2$, VSi, TiSi$_2$, ZrSi$_2$, VSi$_2$, NbSi$_2$ and TaSi$_2$ (2) Borides UB$_2$, UB$_4$, UB$_{12}$, CeB$_6$, AlBl$_2$, CoB, CrB$_2$, CrB$_4$, FeB, MnB, MnB$_2$, MnB$_{12}$, MOB, MoB$_4$, SiB$_4$, SiB$_6$, SiB$_{12}$, TiB$_2$, VB$_2$, YB$_4$, ZrB$_2$, CuB$_{24}$, NiB$_{12}$, BaB$_6$, MgB$_2$, MgB$_4$ and MgB$_{12}$, where the aluminum-containing borides may additionally contain one carbon atom per boron atom, (3) Germanides U$_5$Ge$_3$, BaGe, GdGe, Dy$_5$Ge$_3$, Fr$_5$Ge$_3$ and Ce$_3$Ge$_5$ (4) Tellurides, sulfides and selenides LaS, NdS, Pr$_2$S$_3$, DyS, USe, BaSe, GdSe, LaSe, Nd$_3$Se$_4$, Nd$_2$Se$_3$, PrSe, FrSe, UTe, GdTe, LaTe, NdTe, PrTe, SmTe, DyTe and ErTe (5) Antimonides USb, CeSb, GdSb, LaSb, NdSb, PrSb, DySb, AlSb, CeSb, CrSb, FeSb, Mg$_3$Sb$_2$, Ni$_5$Sb$_2$, CeSb$_3$ and NiSb$_3$ (6) Plumbides CePb, Gd$_5$Pb$_3$, La$_5$Pb$_3$ and Dy$_5$Pb$_4$, where, in the substance classes (1) to (6), up to 10 atom % of the elements may be replaced by Na, K, Rb, Cs, Zn, Cd, Al, Ga, Zr, Mg, S, Cu, Ag, Au, Ti, V, Nb, Ta, Cr, Mo, W, Mn, Re, Fe, Co, Ni or mixtures thereof, providing they are not already present in the combinations, (7) Semiconductor oxides UO$_2$, Bi$_2$O$_3$, CuO, Cu$_2$O, SnO, PbO, ZnO, In$_2$O$_3$, WO$_3$, V$_2$O$_5$, Sb$_2$O$_3$, CoO, NiO, Ce$_2$O$_4$, FeO, Fe$_2$O$_3$, NbO$_2$, CeO$_2$ and BaO, where up to 10 mol % of the oxides may be replaced by Na$_2$O, K$_2$O, CdO, SrO, Al$_2$O$_3$, Ga$_2$O$_3$, Cr$_2$O$_3$ or mixtures thereof, which comprises producing an array of dots of the semiconductor materials of different composition on a conductive sheet substrate, contacting the dots on the side located opposite the substrate with a conductive nonmagnetic plate and maintaining the substrate and the plate at different temperatures and electrically connecting them, the plate being scanned by means of a magnetic field probe and the measuring data being stored and analyzed.

10. An array consisting of at least 10 different semiconductor materials on a conductive substrate, wherein the semiconductor materials are ternary materials selected from one of the following substance classes and formed by combining at least 2 compounds of the substance class:

(1) Silicides

U$_3$Si$_5$, BaSi$_2$, CeSi$_2$, GdSi, NdSi$_2$, CoSi, CoSi$_2$, CrSi$_2$, FeSi, FeSi$_2$, MnSi, MoSi$_2$, WSi$_2$, VSi, TiSi$_2$, ZrSi$_2$, VSi$_2$, NbSi$_2$ and TaSi$_2$ (2) Borides UB$_2$, UB$_4$, UB$_{12}$, CeB$_6$, AlB$_{12}$, CoB, CrB$_2$, CrB$_4$, FeB, MnB, MnB$_2$, MnB$_{12}$, MoB, MoB$_4$, SiB$_4$, SiB$_6$, SiB$_{12}$, TiB$_2$, VB$_2$, YB$_4$, ZrB$_2$, CuB$_{24}$, NiB$_{12}$, BaB$_6$, MgB$_2$, MgB$_4$ and MgB$_{12}$, where the aluminum-containing borides may additionally contain one carbon atom per boron atom, (3) Germanides U$_5$Ge$_3$, BaGe, GdGe, Dy$_5$Ge$_3$, Fr$_5$Ge$_3$ and Ce$_3$Ge$_5$ (4) Tellurides, sulfides and selenides LaS, NdS, Pr$_2$S$_3$, DyS, USe, BaSe, GdSe, LaSe, Nd$_3$Se$_4$, Nd$_2$Se$_3$, PrSe, FrSe, UTe, GdTe, LaTe, NdTe, PrTe, SmTe, DyTe and ErTe (5) Antimonides USb, CeSb, GdSb, LaSb, NdSb, PrSb, DySb, AlSb, CeSb, CrSb, FeSb, Mg$_3$Sb$_2$, Ni$_5$Sb$_2$, CeSb$_3$ and NiSb$_3$ (6) Plumbides CePb, Gd$_5$Pb$_3$, La$_5$Pb$_3$ and Dy$_5$Pb$_4$, where, in the substance classes (1) to (6), up to 10 atom % of the elements may be replaced by Na, K, Rb, Cs, Zn, Cd, Al, Ga, Zr, Mg, S, Cu, Ag, Au, Ti, V, Nb, Ta, Cr, Mo, W, Mn, Re, Fe, Co, Ni or mixtures thereof, providing they are not already present in the combinations, (7) Semiconductor oxides UO$_2$, Bi$_2$O3, CuO, Cu$_2$O, SnO, PbO, ZnO, In$_2$O$_3$, WO$_3$, V$_2$O$_5$, Sb$_2$o$_3$, CoO, NiO, Ce$_2$O$_4$, FeO, Fe$_2$O3, NbO$_2$, CeO$_2$ and BaO, where up to 10 mol % of the oxides may be replaced by Na$_2$O, K$_2$O, CdO, SrO, Al$_2$O$_3$, Ga$_2$O$_3$, Cr$_2$O$_3$ or mixtures thereof.

* * * * *

UNITED STATES PATENT AND TRADEMARK OFFICE
CERTIFICATE OF CORRECTION

PATENT NO. : 6,444,894 B1
DATED : September 3, 2002
INVENTOR(S) : Sterzel et al.

It is certified that error appears in the above-identified patent and that said Letters Patent is hereby corrected as shown below:

Title page,
Item [57], ABSTRACT,
Line 5, "suicides" should be -- silicides --.

Column 15,
Line 39, "suicides" should be -- silicides --.

Column 16,
Line 11, "YB4" should be -- $YB_4$ --.
Line 17, "UCGe₃" should be -- $U_5Ge_3$ --.
Line 24, "MN₃Sb₂" should read -- $Mg_3Sb_2$ --.
Line 62, "MOB" should be -- MoB --.
Line 63, "CUB₂₄" should be -- $CuB_{24}$ --.

Column 17,
Line 2, "Ges" should be -- $Ge_5$ --.
Line 43, "AIBI₂" should be -- $AIB_{12}$ --.
Line 44, "MOB" should be -- MoB --.

Signed and Sealed this

Twenty-eighth Day of January, 2003

JAMES E. ROGAN
*Director of the United States Patent and Trademark Office*